(12) United States Patent
Yue et al.

(10) Patent No.: US 10,365,303 B2
(45) Date of Patent: Jul. 30, 2019

(54) SHUNT STRIP

(71) Applicant: Texas Instruments Incorporated, Dallas, TX (US)

(72) Inventors: Fatt Seng Yue, Kuala Lumpur (MY); Wan Mohd Misuari Suleiman, Kuala Lumpur (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/141,639

(22) Filed: Apr. 28, 2016

(65) Prior Publication Data

US 2017/0317013 A1  Nov. 2, 2017

(51) Int. Cl.
| | | |
|---|---|---|
| H01L 29/00 | (2006.01) | |
| H01L 21/82 | (2006.01) | |
| G01R 15/14 | (2006.01) | |
| H01L 23/31 | (2006.01) | |
| H01L 23/00 | (2006.01) | |
| H01L 21/78 | (2006.01) | |
| H01L 23/62 | (2006.01) | |
| G01R 19/00 | (2006.01) | |

(52) U.S. Cl.
CPC ............ *G01R 15/146* (2013.01); *H01L 21/78* (2013.01); *H01L 23/3157* (2013.01); *H01L 23/62* (2013.01); *H01L 24/29* (2013.01); *G01R 19/0092* (2013.01)

(58) Field of Classification Search
CPC ... H01L 23/49548; H01L 21/78; H01L 24/29; H01L 27/0802; H01C 13/02; G01R 15/146
See application file for complete search history.

(56) References Cited

U.S. PATENT DOCUMENTS

| | | | | |
|---|---|---|---|---|
| 5,214,407 | A  * | 5/1993 | McKim, Jr. ............ | G01R 1/203 338/120 |
| 7,411,291 | B2 * | 8/2008 | Baier ...................... | H01L 23/62 257/723 |
| 7,847,391 | B2 | 12/2010 | Udompanyavit et al. | |
| 8,053,898 | B2 | 11/2011 | Marcoux | |
| 8,102,668 | B2 * | 1/2012 | Hauenstein ........... | H01L 23/495 174/260 |
| 8,129,228 | B2 | 3/2012 | Udompanyavit et al. | |
| 8,324,721 | B2 | 12/2012 | Udompanyavit et al. | |
| 8,471,674 | B2 * | 6/2013 | Yoshioka ............... | G01R 1/203 29/610.1 |

(Continued)

OTHER PUBLICATIONS

Suleiman, Wan Mohd Misuari; Krishnan, Nageswararau; U.S. Appl. No. 15/145,083, filed May 3, 2016 for "Component Sheet and Method of Singulating," 21 pages.

(Continued)

*Primary Examiner* — Alonzo Chambliss
(74) *Attorney, Agent, or Firm* — Ronald O. Neerings; Charles A. Brill; Frank D. Cimino

(57) ABSTRACT

A shunt strip that includes a plurality of shunts arranged in a grid with each of the shunts spaced from an adjacent shunt by a shunt-gap. A plurality of tabs connect the plurality of shunts and at least one tab is positioned within each shunt-gap. Also, a shunt with a generally parallelepiped shaped body has severed tab portions extending outwardly and downwardly from the body.

26 Claims, 9 Drawing Sheets

(56) References Cited

U.S. PATENT DOCUMENTS

| | | | | |
|---|---|---|---|---|
| 8,551,820 B1* | 10/2013 | Foster | ............... | H01L 24/97 |
| | | | | 257/666 |
| 8,697,496 B1 | 4/2014 | Abbott et al. | | |
| 8,871,571 B2* | 10/2014 | Sirinorakul | ............ | H01L 23/36 |
| | | | | 257/666 |
| 8,928,115 B2 | 1/2015 | Hauenstein | | |
| 2007/0063333 A1 | 3/2007 | Mohd Arshad | | |
| 2009/0174522 A1* | 7/2009 | Schulz | ............... | G01R 1/203 |
| | | | | 338/49 |
| 2011/0033985 A1* | 2/2011 | Udompanyavit | ............ | H01L 23/49548 |
| | | | | 438/123 |
| 2013/0221532 A1* | 8/2013 | Fujita | ............... | H01L 24/34 |
| | | | | 257/773 |
| 2014/0175626 A1* | 6/2014 | Abbott | ............ | H01L 21/568 |
| | | | | 257/666 |
| 2014/0306330 A1 | 10/2014 | Williams | | |
| 2015/0311144 A1 | 10/2015 | Williams et al. | | |
| 2015/0318247 A1* | 11/2015 | Kunimitsu | ............ | H01L 25/07 |
| | | | | 257/676 |
| 2015/0380384 A1 | 12/2015 | Williams et al. | | |
| 2016/0005732 A1 | 1/2016 | Wood | | |
| 2016/0240288 A1* | 8/2016 | Chiku | ............... | H01C 1/04 |

OTHER PUBLICATIONS

Suleiman, Wan Mohd Misuari, U.S. Appl. No. 15/165,578, filed May 26, 2016 for "Methods and Devices for Dicing Components From a Sheet of Copper Alloy," 15 pages.

* cited by examiner

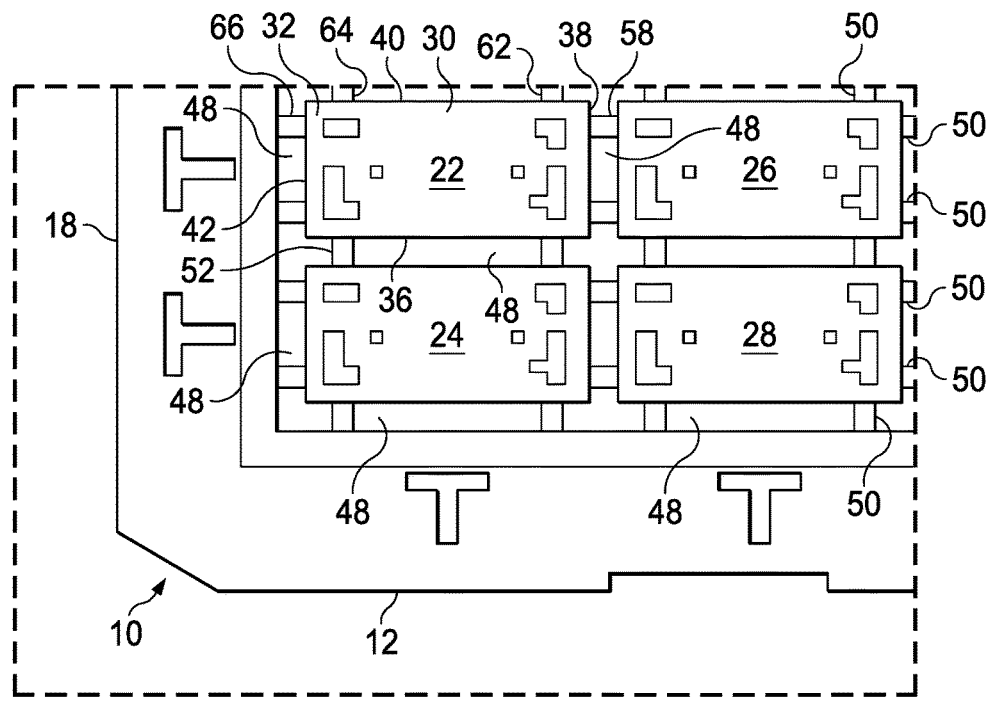
FIG. 2
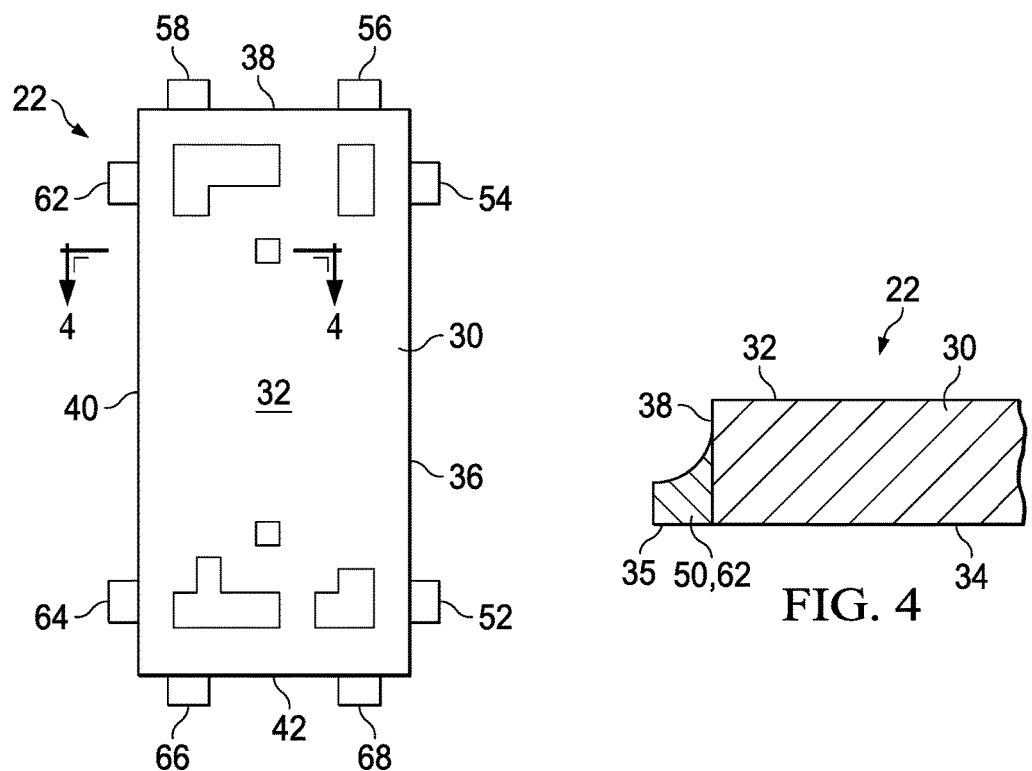
FIG. 3
FIG. 4

211 — ETCHING A STRIP OF MATERIAL TO PROVIDE A SHUNT STRIP WITH A PLURALITY OF SHUNTS ARRANGED IN LINEAR ROWS AND COLUMNS WITH ADJACENT ONES OF THE PLURALITY OF SHUNTS CONNECTED BY SHUNT TABS

FIG. 15

221 — ETCHING A STRIP OF MATERIAL TO PROVIDE A SHUNT STRIP WITH A PLURALITY OF SHUNTS ARRANGED IN LINEAR ROWS AND COLUMNS WITH ADJACENT ONES OF THE PLURALITY OF SHUNTS CONNECTED BY SHUNT TABS

222 — SINGULATING THE SHUNT STRIP BY CUTTING THROUGH THE SHUNT TABS

223 — ATTACHING A SHUNT SINGULATED FROM SAID SHUNT STRIP TO A LEADFRAME WITH A LAYER OF BONDING MATERIAL HAVING A BOND LINE THICKNESS ABOUT THE SAME AS THE DOWNSET OF A SHUNT PILLAR PRODUCED BY TAB CUTTING

FIG. 16

231 — CUTTING THROUGH THE SHUNT TABS WITH A PUNCH

FIG. 17

SHUNT STRIP

BACKGROUND

Shunt resistors (referred to herein simply as "shunts") are used to determine the current flow through electrical components or circuits. A typical shunt of the type used in an integrated circuit ("IC") package usually comprises a metal plate that is electrically connected, for example by wire bonding, to the component or circuit. The voltage drop across the shunt is measured. This measured voltage drop is then used to calculate the current through the component or circuit.

SUMMARY

A shunt strip including a plurality of shunts arranged in a grid, each of the shunts is spaced from an adjacent shunt in the grid by a shunt-gap. A plurality of tabs connect the plurality of shunts. At least one tab is positioned within each shunt-gap.

A method of producing shunts for IC packages includes etching a strip of material to provide a shunt strip with a plurality of shunts arranged in linear rows and columns and with adjacent shunts connected by shunt tabs.

A method of making IC packages includes etching a strip of material to provide a shunt strip with a plurality of shunts arranged in linear rows and columns with adjacent shunts connected by shunt tabs. The method includes singulating the shunt strip by cutting through the shunt tabs. The method further includes attaching a shunt singulated from the shunt strip to a leadframe with a layer of bonding material having a bond line thickness of about the same height as the height of a shunt down-set produced by tab cutting.

A shunt includes a metal plate body with severed tab portions extending outwardly from the body portion.

A method of singulating a shunt strip having a plurality of shunt bodies attached by shunt tabs includes cutting through the shunt tabs with a punch assembly.

An integrated circuit package includes a leadframe having a die attach pad and a plurality of leads. A die is operably mounted on the die attach pad. A shunt includes a metal plate body portion with down-sets extending outwardly and downwardly from the body portion with the shunt connected to at least one of the plurality of leads by a layer of bonding material with a bond line thickness. The down-sets penetrate the layer of bonding material and electrically engage at least one of the plurality of leads and support the shunt above the leads at about the bond-line thickness of the bonding material. A layer of mold compound encapsulates at least portions of the leadframe, the die and the shunt.

BRIEF DESCRIPTION OF THE DRAWINGS

FIG. 2 is a detail top plan view of a portion of the shunt strip of FIG. 1.

FIG. 3 is a top plan view of a shunt singulated from the shunt strip of FIGS. 1 and 2.

FIG. 4 is a magnified cross-sectional elevation view of a shunt shown in FIG. 3.

FIG. 15 is a flow chart illustrating a method of producing shunts for IC packages.

FIG. 16 is a flowchart illustrating a method of making IC packages.

FIG. 17 is a flowchart illustrating a method of singulating a shunt strip.

DETAILED DESCRIPTION

Figure 1:
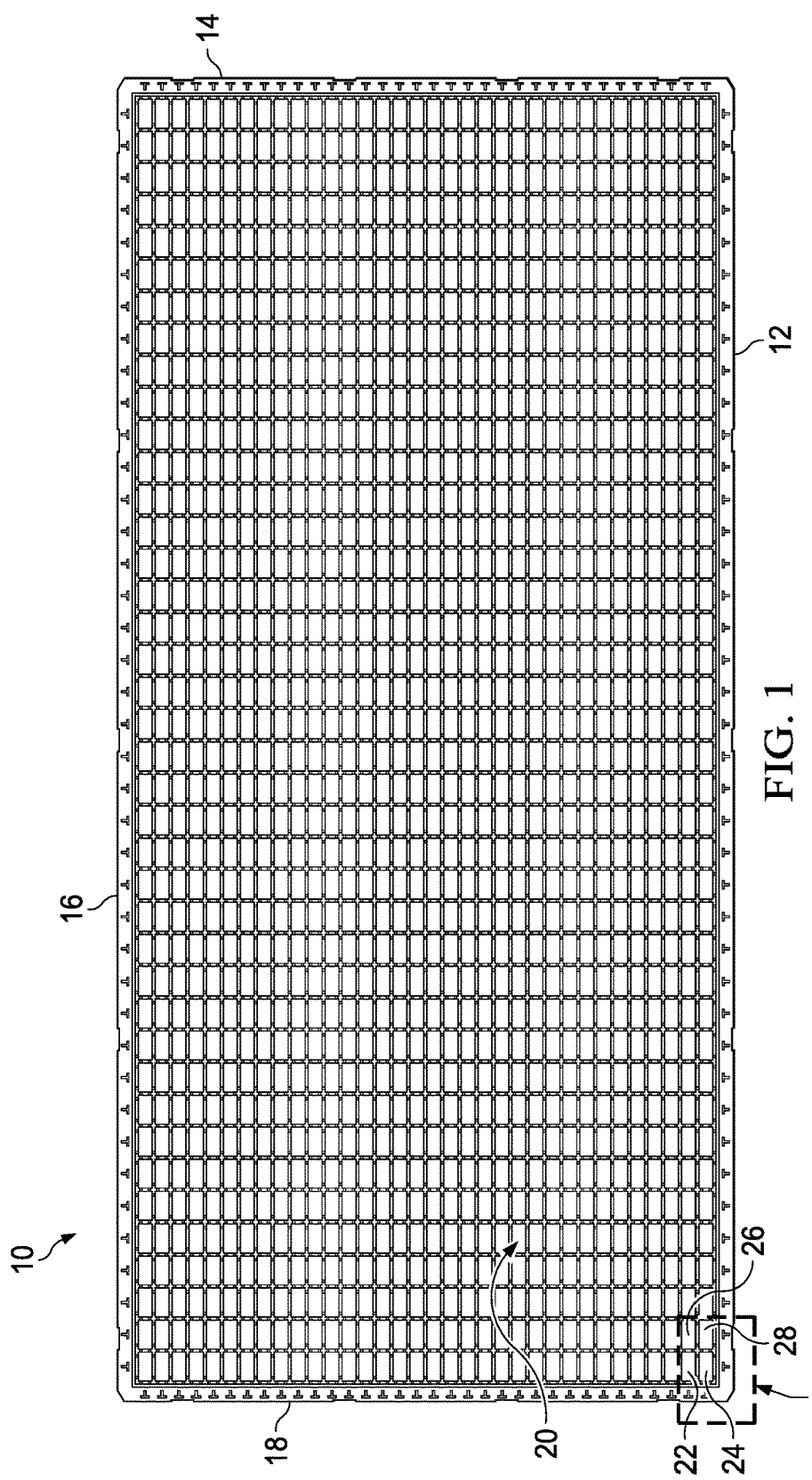
FIG. 1 is a top plan view of a shunt strip.

FIG. 1 is a top plan view of a shunt strip 10, and FIG. 2 is a detail top plan view of a portion of the shunt strip 10 of FIG. 1. The shunt strip 10 comprises outer rail portions 12, 14, 16 and 18 positioned around a rectangular grid of shunts 20. The array of shunts 20 include individual shunts 22, 24, 26 and 28 that are positioned in the lower left-hand corner of the shunt strip 10. Each of the shunts 20, e.g., shunts 22, 24, 26 and 28, may comprise a generally rectangular plate shaped body portion 30. The body portion 30 includes a top face 32, a bottom face 34 (FIG. 4), and four lateral side faces 36, 38, 40, 42. A typical thickness of a shunt body portion 30 is 0.203 mm. The example shunt strip 10 of FIG. 1 is a 40×34 shunt array in a shunt strip that measures 144.86 mm×57.00 mm. Other shunt arrays configurations, shunt shapes, shunt thicknesses and shunt strip sizes may be used.

FIG. 3 is a top plan view of shunt 22 after it has been singulated from the shunt strip 10. FIG. 4 is a cross-sectional detail view of shunt 22 shown in FIGS. 1, 2 and 3.

As best shown by FIG. 2, each of the shunt body portions 30 is separated from adjacent body portions 30 or adjacent rails 12, 14, 16 or 18 by a shunt-gap 48. Each shunt is connected to adjacent shunts or rails by a plurality of tabs 50 positioned in the shunt-gaps 48. For example, in the illustrated embodiment each lateral side of shunt 22 is connected to rail 18 and adjacent shunts by two tabs 50. Thus, shunt 22 is supported within the shunt strip 10 by a total of eight tabs 50, specifically tabs 52, 54, 56, 58, 62, 64, 66, and 68. In the illustrated embodiment, each of these tabs 50 has been formed by half etching the upper portion of the shunt strip 10. Thus, as best shown by FIG. 4, the bottom surface 34 of each shunt body portion 30 is coplanar with the bottom surface 35 of each tab 50, e.g., tab 62, that extends outwardly therefrom. Each shunt-gap 48 comprises a volume of empty space and a volume of tab material. In the illustrated embodiment of FIGS. 1 and 2, the volume of empty space is significantly greater than the volume of tab material, e.g., about 10 times greater in one embodiment. In slightly different words, each shunt-gap 48 has a total gap volume that includes a tab volume and an open space volume and the open space volume exceeds the tab volume.

The thickness of each of the tabs 50 in the illustrated embodiment of FIGS. 1-4 is about half the thickness of the shunt body portion 30, but other embodiments may have different tab thicknesses. One advantage of forming a shunt strip with etched shunt-gaps 48 between shunts with the shunts connected by tabs 50 is that this forming technique reduces the amount of metal that must be cut during subsequent shunt singulation, as described in detail below. Half etching the tabs 50 further reduces the amount of metal that must be cut during shunt singulation. In one embodiment, the plurality of shunts in a shunt strip has an average thickness value; and the plurality of tabs in the strip has an average thickness value less than the average thickness value of the shunts.

In some embodiments (not shown) no half etching is performed and each tab has the same thickness as the associated shunt body portion 30. Even in such embodiments in which the tabs 50 are not half etched, the amount of metal cut during shunt singulation is significantly less than the amount of metal that must be cut to singulate a shunt strip that is formed without shunt-gaps 48 and connecting tabs 50.

Another advantage of a process that combines shunt etching with tab sawing is that it precisely controls the size of the singulated shunts. In an un-etched shunt strip, shunts are singulated from the strip exclusively by sawing. The size of shunts produced by sawing alone is more variable than that of shunts produced by the combined etching and sawing process described herein.

Figure 5:
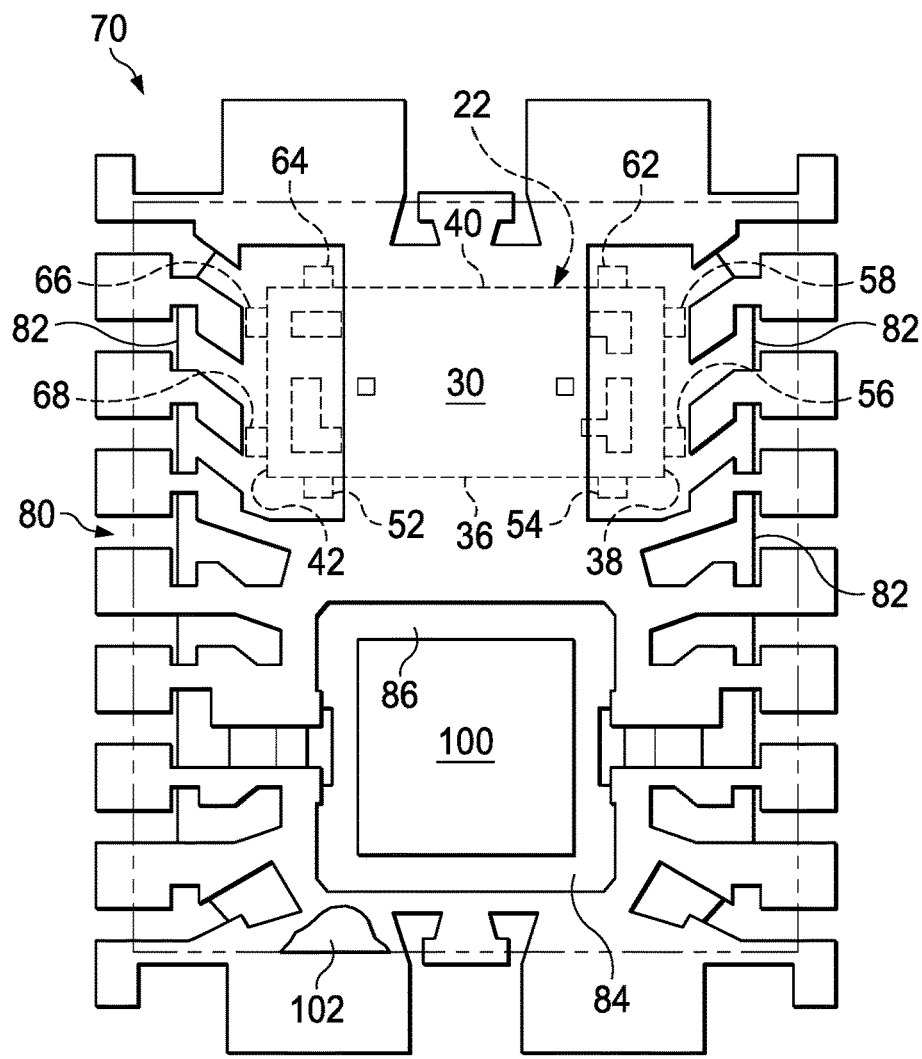
FIG. 5 is a top, partially cutaway view of an integrated circuit package with a shunt mounted on a leadframe.

FIG. 5 is a top, partially cutaway view of an integrated circuit (IC) package 70. The IC package 70 includes a lead frame 80 having leads 82 and a die attach pad 84. The leadframe 80 has an upper surface 86. A shunt 22, is mounted on leads 82 of the leadframe 80. (The shunt 22 in FIG. 5 is shown as transparent for illustrative purposes.) A die 100 is mounted on the die pad 84. The shunt 22 may be electrically connected to the die 100 and to other electrical components or circuits as by wire bonding or other electrical connection (not shown).

Figure 6:
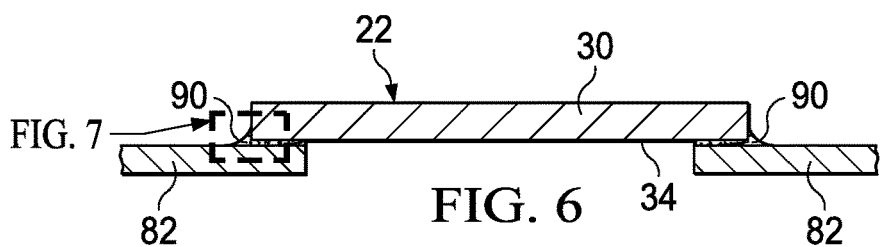
FIG. 6 is a cross-sectional elevation view of the IC package of FIG. 5.
Figure 7:
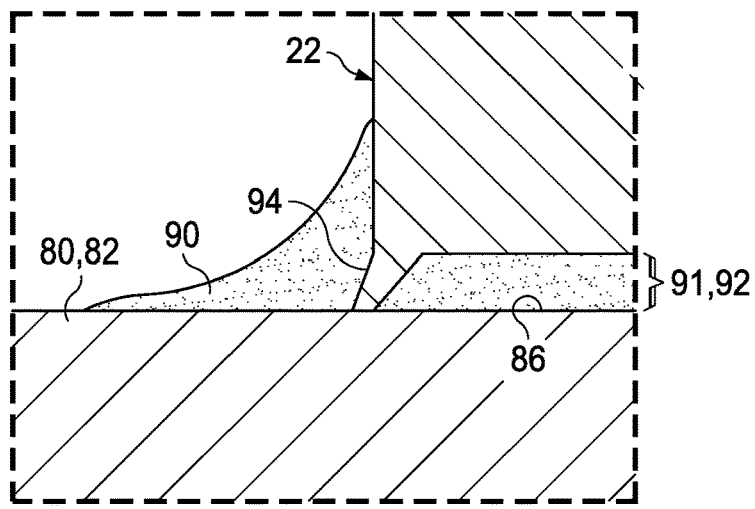
FIG. 7 is a magnified elevation view of a shunt attached to a lead frame by a layer of bonding material.

FIG. 6 is a cross-sectional elevation view of FIG. 5 showing shunt 22 attached to a lead 82 of leadframe 80 by a layer of bond material 90. FIG. 7 is a magnified elevation view of a portion of FIG. 6 showing the shunt 22 attached to leads 82 of a leadframe 80 by a layer of bonding material 90. As may be seen from FIG. 7, during singulation of shunt 22, a downwardly extending "tail" remnant 94 of the associated tab, e.g., 68, FIG. 3, is produced. This tail remnant 94 is also referred to herein as "shunt down-set 94" because it extends downwardly from the horizontal bottom surface of the shunt 22. It engages the top surface of the lead 82 supporting the shunt 22 at a spaced distance above the lead 82. The layer of bond material 90 has a thickness ("bond line thickness" 92) equal to a down-set height 91 of the shunt down-set 94. The shunt down-set 94 increases the structural integrity of the IC package because it allows a relatively thick layer of bonding material 90 to be applied between the lead 82 and shunt 22. Although the bonding material 90 is a conductive material, such as conductive epoxy, solder, etc., the direct engagement of the shunt down-set 94 with the lead 82 helps to improve electrical contact between the shunt 22 and the lead 82. A typical bond line thickness 92 may be about 0.013 mm.

Referring again to FIG. 5, a die 100 is conventionally mounted on the die attach pad 84. The shunt 22, die 100 and lead frame 80 are encased in a layer of mold compound 102, a small portion of which is shown in FIG. 5. Leads 82 are exposed at the side faces of the mold compound layer 102.

Figure 8:
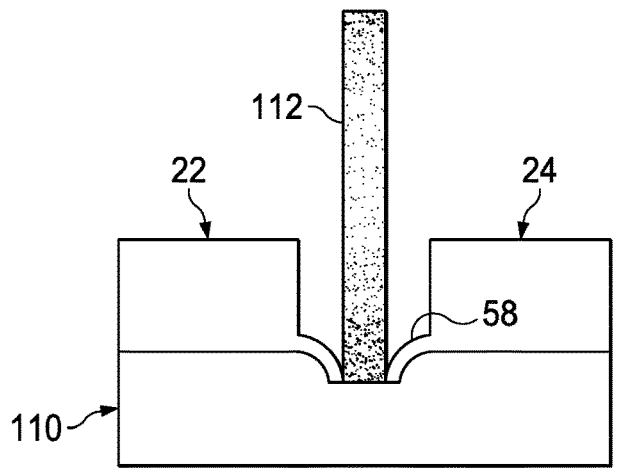
FIG. 8 is a schematic elevation view showing cutting of a shunt tab with a composite blade.
Figure 9:
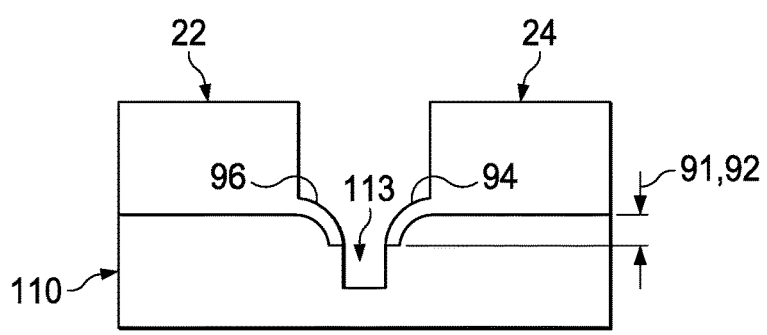
FIG. 9 is a schematic elevation view showing a cut shunt tab.

Singulation of shunts 20 from the shunt strip 10 will now be described with reference to FIGS. 8 through 13. As shown in FIGS. 8-13, prior to singulation, the shunt strip 10 has dicing tape 110 applied to the bottom surface thereof. FIG. 8 is a schematic elevation view showing cutting of the shunt tab 58 extending between shunts 22 and 24. The cut is made with an abrasive composite blade 112. FIG. 9 is a schematic elevation view showing that, as a result of the cutting by composite blade 112, the shunt tab 58 has been urged downwardly and cut into two downwardly and outwardly extending portions 94, 96. One of these downwardly extending portions 94 is the shunt down-set 94 shown in FIG. 7. The cutting by composite blade 112 also forms a slot 113 in the dicing tape 110. The distance below the horizontal bottom surface of the shunt 22 or 24 that the shunt down-set 94 extends defines the shunt down-set height 91.

Figure 10:
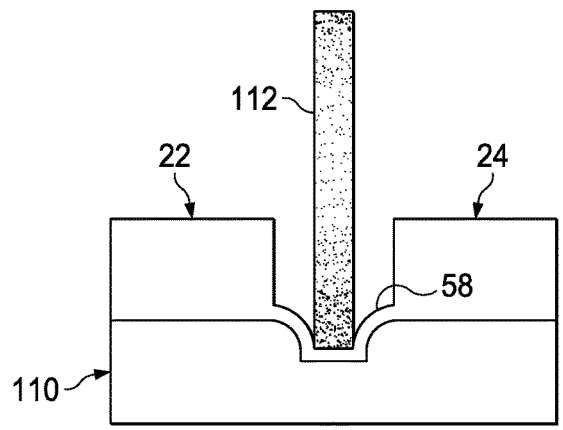
FIG. 10 is a schematic elevation view showing partial cutting of a shunt tab with a composite blade.
Figure 11:
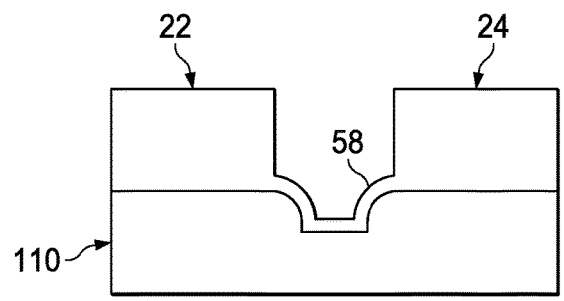
FIG. 11 is a schematic elevation view showing the partially cut shunt tab.
Figure 12:
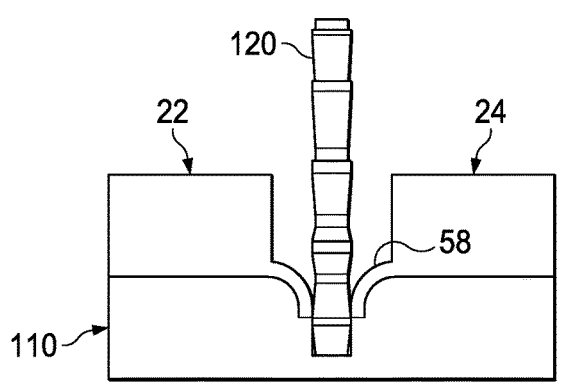
FIG. 12 is a schematic elevation view showing severing of the partially cut shunt tab of FIG. 11 with a toothed saw blade.

Another method of singulation is illustrated in FIGS. 10 through 13. FIG. 10 is a schematic elevation view showing partial cutting of a shunt tab with a composite blade 112. In FIG. 10, unlike FIG. 9, the composite blade 112 does not cut entirely through the tab 58. However, it does urge the tab 58 downwardly a distance that is a relatively constant distance from tab to tab. FIG. 11 is a schematic elevation view showing the partially cut shunt tab 58 produced by the operation of FIG. 10. FIG. 12 is a schematic elevation view showing severing of the deformed and partially cut shunt tab 58 of FIG. 11 with a toothed saw blade 120.

Figure 13:
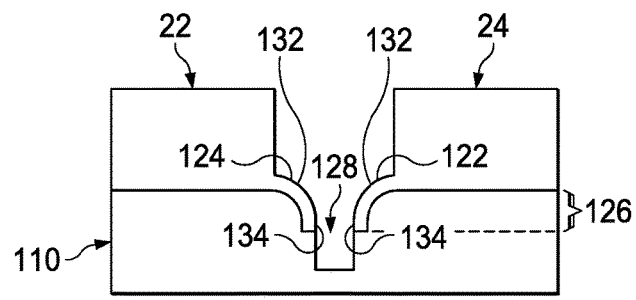
FIG. 13 is a schematic elevation view showing the severed shunt tab.

FIG. 13 is a schematic elevation view showing two tails or shunt down-sets 122, 124 resulting from severing shunt tab 58 with the toothed saw blade 120 in FIG. 12. The down-set height 126 of the two shunt down-sets 122, 124 is a distance that is less variable from tab to tab than that produced by the operation shown in FIGS. 8 and 9. This is significant in that the down-set height 126 of the shunt down-sets is what defines the ideal bond line thickness 92, FIG. 7, for any particular tab. By maintaining this bond line thickness 92 constant from tab to tab, the quality of the tab to leadframe connections are improved.

It will be appreciated from FIGS. 10-13 and the associated description thereof that an upper surface portion 132 of each shunt down-set 122, 124, FIG. 13, will be an abrasive blade cut surface portion and a lower surface portion 134 thereof will be a toothed blade cut surface portion.

Variations in the height of shunt down-sets produced in the singulation process, as well as decreasing the electrical and adhesive effectiveness of bonding material also contributes to shunt tilting within an IC package 70, in the same way a 4 legged table tilts when one or more of the legs are of different lengths.

FIGS. 14A-14F schematically illustrate a process of shunt singulation and mounting of the singulated shunt on a leadframe. The elevation views shown in FIGS. 14A-14D depict singulation operations being performed on one side of a shunt 144 by a punch assembly 160. However, the punch assembly 160 actually has a total of eight opposed prong sets, i.e., two double prong sets on each side of the four sided punch assembly 160. Thus, essentially identical operations to those shown in FIGS. 14A to 14D are performed by the punch assembly 160 all four sides of the shunt 144 simultaneously.

Figure 14A:
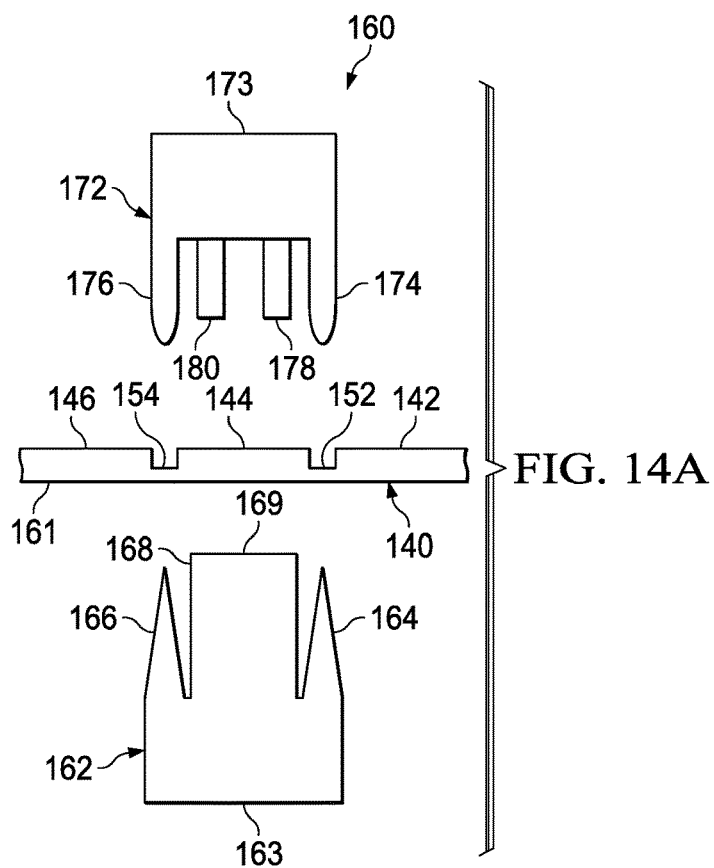
FIG. 14A is a schematic elevation view illustrating a first operating state of a punch assembly performing shunt singulation and leadframe mounting.

As shown by FIG. 14A, the punch assembly 160 is used to singulate a shunt strip 140 comprising a plurality of shunts 142, 144, 146, etc., that are connected by a plurality of half etched shunt tabs 152, 154. The shunt strip 140 has a continuous flat bottom surface 161 and may have the same structure as the shunt strip 10 described with reference to FIGS. 1-4.

The punch assembly 160 includes a lower punch member 162 and an upper punch member 172 that are disposed on opposite sides of the shunt strip 140. Lower punch member 162 includes a central body portion 163 having sharp ended prong members 164, 166 extending upwardly from opposite ends of the side of the punch member 162 that is shown. A pedestal portion 168 having a flat top surface 169 extends upwardly from a central portion of the central body portion 163 to a height slightly above that of the prong members 164, 166.

Upper punch member 172 includes a central body portion 173. Blunt ended prong portions 174, 176 extend downwardly from opposite ends of the side of the central body portion 173 that is shown. At least one vacuum conduit member, vacuum conduit members 178, 180 in this embodiment, extend downwardly from the central body portion 173 a distance less than that of the prong portions 174, 176.

Figure 14B:
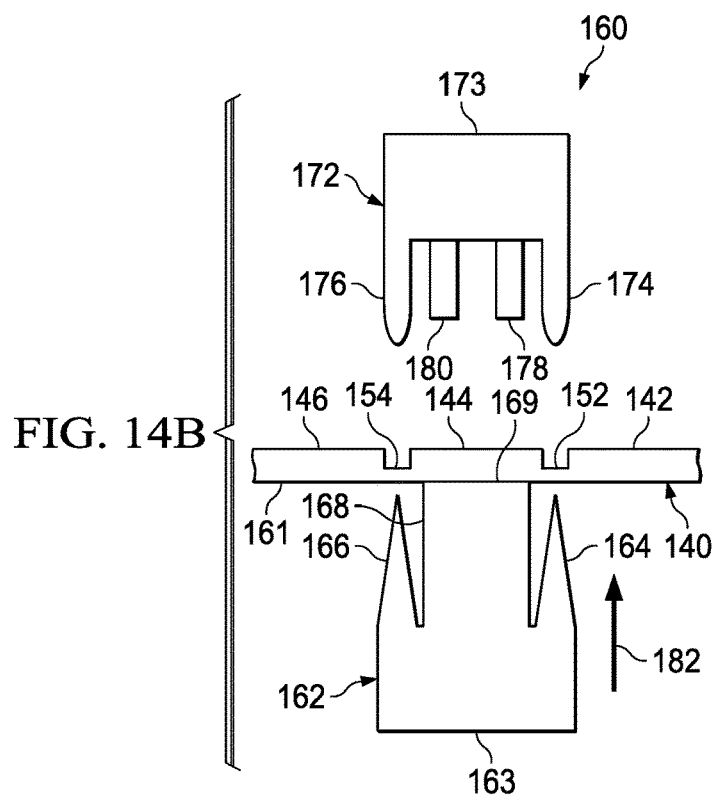
FIG. 14B is a schematic elevation view illustrating a second operating state of a punch assembly performing shunt singulation and leadframe mounting.

In FIG. 14B lower punch member 162 has been moved upwardly, as indicated by arrow 182, to a position where the flat top surface 169 of pedestal portion 168 engages the flat bottom surface 161 of the shunt strip in alignment with shunt 144. At this position the sharp ended prong members 164, 166 are spaced a short distance below the flat bottom surface 161 of the strip 140 and in alignment with the tabs 152, 154.

Figure 14C:
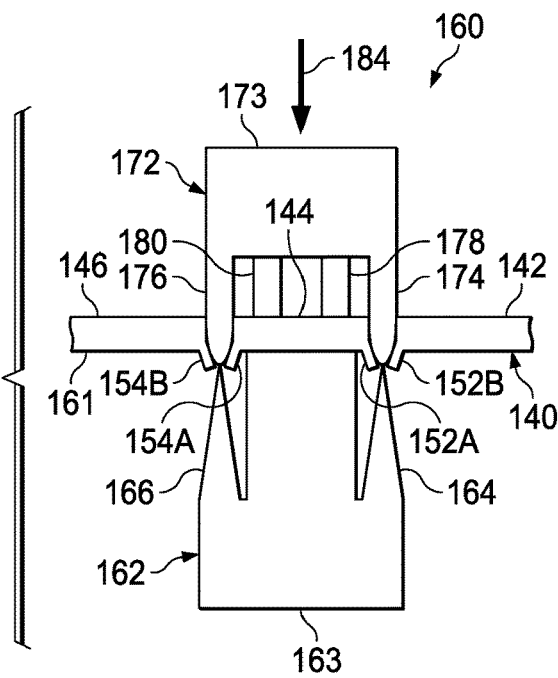
FIG. 14C is a schematic elevation view illustrating a third operating state of a punch assembly performing shunt singulation and leadframe mounting.
Figure 14D:
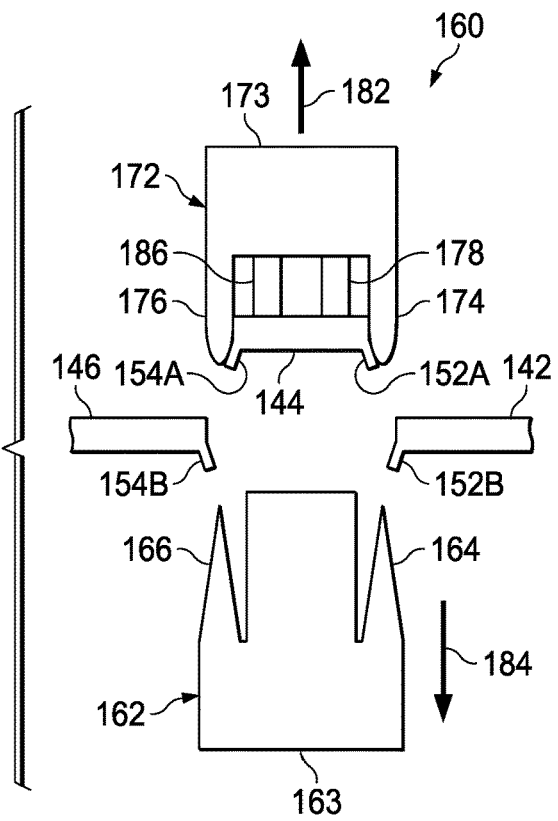
FIG. 14D A is a schematic elevation view illustrating a fourth operating state of a punch assembly performing shunt singulation and leadframe mounting.

Next, as illustrated by FIG. 14C, the upper punch member 172 is moved downwardly, as indicated by arrow 184. As punch member 172 is moved downwardly the blunt ended of prong members 174, 176 engage the tabs 152, 154 and deforms each tabs into a downwardly extending U-shape until the tab engages the opposed sharp ended prong members 164 or 166. Engagement with sharp ended prong members 164 or 166 causes the associated deformed tab 152 or 154 to be cut in half forming tails/pillars/down-sets ("shunt down-sets") 152A and 152B. Similarly cutting tab 154 forms shunt down-sets 154A and 154B. Also, vacuum conduit members 178, 180, which are in fluid communication with a vacuum source, engage the top surface of shunt 144 and are held to it by vacuum/suction force.

Figure 14E:
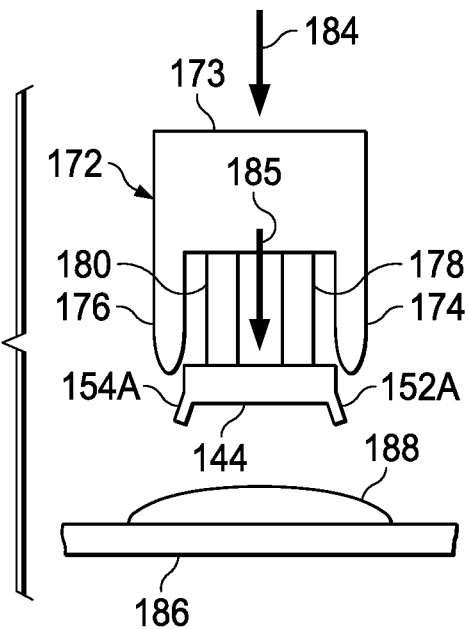
FIG. 14E is a schematic elevation view illustrating a fifth operating state of a punch assembly performing shunt singulation and leadframe mounting.

As illustrated by FIG. 14E, after the shunt down-sets 152, 154 are severed, the lower punch member 162 is moved downwardly 184 and the upper punch member is moved upwardly 182. The shunt 144 remains engaged with the vacuum conduit members 178, 180 and move upwardly with it separating shunt 144 from shunts 142 and 146.

Next, as illustrated by FIG. 14E, the upper punch member 172 is positioned above a leadframe 186 with a patch of conductive material 188 applied to a predetermined portion of it. The conductive material 188 may be, for example, uncured conductive epoxy or liquid solder paste. Once the top punch member 172 is positioned above the leadframe, it is moved downwardly 184 to a predetermined elevation. At that elevation, the vacuum conduit member 178, 180 are displaced downwardly 185 from the upper punch member until the shunt down-sets 152A, 154A penetrate the conductive material 188 and engage the top surface of the leadframe 186.

Figure 14F:
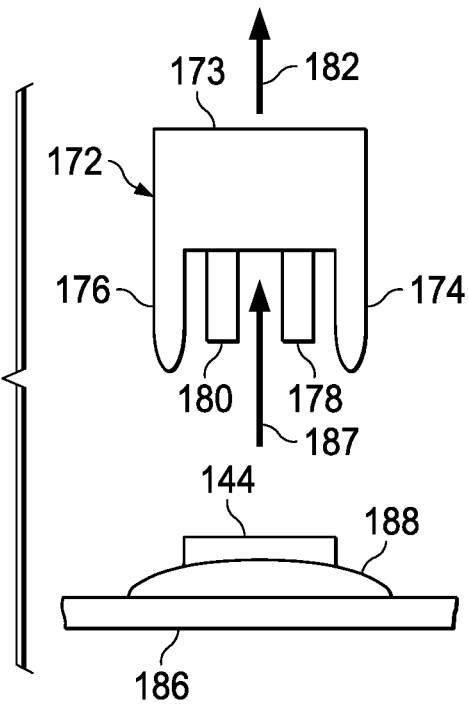
FIG. 14F is a schematic elevation view illustrating a sixth operating state of a punch assembly performing shunt singulation and leadframe mounting.

As shown by FIG. 14F, the application of vacuum holding force to the shunt 144 is then terminated; the vacuum conduit member 178, 180 are displaced upwardly 182 into the upper punch member 172 and the upper punch member is itself moved (by a conventional displacement assembly, not shown) upwardly 182 and away from the leadframe 186. Thus the upper punch member 172 acts as a pick-and-place machine to place the singulated shunt 144 on the leadframe 186 after the punch assembly 160 has singulated shunt 144 from the etched shunt sheet 140. Including a shunt holding mechanism for shunt pick up and attachment to a leadframe provides several advantages because it combines two separate processes and thereby significantly improves assembly throughput, cycle time, and efficiency. It reduces cost by allowing a single operator and single machine to perform processes that would ordinarily require two operators and two separate machines.

After the operation shown in FIG. 14F, the leadframe 186 with the shunt 144 and conductive material 188 is moved to a curing oven/furnace where the conductive material 188 is cured or reflowed to permanently attach the shunt 144 to the leadframe 186. Other operations are also performed to electrically connect the shunt 144 to an associated die (not shown) mounted on the leadframe. After these operations, the entire assembly may be molded, etc., in a conventional manner to complete the formation of an integrated circuit package with an internal shunt.

As illustrated by FIG. 15, a method of producing shunts for IC packages includes, as shown at block 211, etching a strip of material to provide a shunt strip with a plurality of shunts arranged in linear rows and columns and with adjacent ones of the plurality of shunts connected by shunt tabs.

As illustrated by FIG. 16, a method of making IC packages includes, as shown at block 221, etching a strip of material to provide a shunt strip with a plurality of shunts arranged in linear rows and columns with adjacent ones of the plurality of shunts connected by shunt tabs. The method also includes, as shown at block 222, singulating the shunt strip by cutting through the shunt tabs. The method further includes, as shown at block 223, attaching a shunt singulated from the shunt strip to a leadframe with a layer of bonding material having a bond line thickness about the same as the height of a shunt shunt down-set produced by tab cutting.

As illustrated by FIG. 17, a method of singulating a shunt strip having a plurality of shunt bodies attached by shunt tabs includes, as shown at block 231, cutting through the shunt tabs with a punch assembly.

Although various embodiments of shunt strips and methods of singulating the shunt strips and integrated circuit packages incorporating such shunt strips have been expressly described in detail herein, various alternative embodiments of such shunt strips and associated singulation methods and integrated circuit packages will become obvious to those skilled in the art after reading this disclosure. It is intended that the language of the appended claims be construed broadly so as to cover all such alternative embodiments, except to the extent limited by the prior art.

What is claimed is:
1. A shunt resistor strip comprising:
a plurality of shunt resistors arranged in a grid, a first row of shunt resistors in the grid being spaced from a second row of shunt resistors in the grid by a shunt-gap; and a plurality of tabs directly connecting the shunt resistors in the first row to the shunt resistors in the second row.

2. The shunt resistor strip of claim 1, wherein the shunt-gap has a total gap volume that includes a tab volume and an open space volume and wherein the open space volume exceeds the tab volume.

3. The shunt resistor strip of claim 1,
the plurality of shunt resistors comprising an average thickness value; and
the plurality of tabs comprising an average thickness value less than the average thickness value of the plurality of shunt resistors.

4. The shunt resistor strip of claim 1 wherein the plurality of shunt resistors and the plurality of tabs are composed of the same material.

5. The shunt resistor strip of claim 1 wherein each pair of adjacent shunt resistors are connected by at least two spaced apart tabs.

6. A shunt resistor strip comprising:
a plurality of shunt resistors arranged in a grid, each of the shunt resistors being spaced from an adjacent shunt resistor in the grid by a shunt-gap; and
a plurality of half etched tabs connecting the plurality of shunt resistors, at least one tab being positioned within each shunt-gap.

7. A shunt resistor comprising a generally metal plate body portion with severed tab portions extending outwardly and downwardly from the body portion, wherein the shunt resistor is attached to a lead frame and wherein the severed tab portions of the shunt resistor are encased in bonding compound that attaches the shunt resistor to the leadframe.

8. The shunt resistor of claim 7 wherein the severed tab portions of the shunt resistor engage the leadframe.

9. A device, comprising:
a shunt resistor comprising a generally metal plate body portion with severed tab portions extending outwardly and downwardly from the body portion, the severed tab portions of the shunt resistor encased in bonding compound that attaches the shunt resistor to a leadframe wherein the severed tab portions of the shunt resistor engage the leadframe and all have about the same down-set height.

10. The device of claim 9, the severed tab portions all having an abrasive blade cut surface and a toothed blade cut surface.

11. An integrated circuit package comprising:
a leadframe having a die attach pad and a plurality of leads;
a die mounted on the die attach pad;
a shunt resistor comprising a metal plate body portion with shunt resistor down-sets extending outwardly and downwardly from the body portion, said shunt resistor being connected to at least one of said plurality of leads by a layer of bonding material with a bond line thickness, wherein said shunt resistor down-sets penetrate said layer of bonding material and electrically engage at least one of said plurality of leads and support said shunt resistor above said leads at about the bond-line thickness of the bonding material; and
a layer of mold compound encapsulating at least portions of the leadframe, the die and the shunt resistor.

12. A punch assembly for singulating a plurality of shunt resistors connected by tabs comprising a punch member having:
tab engaging portions operable in severing the tabs; and
a shunt resistor engaging portion operable to engage and hold a shunt resistor singulated from the plurality of shunt resistors and to place and release the shunt resistor on a leadframe.

13. An integrated circuit package comprising:
a leadframe having a die attach pad and a plurality of leads;
a die mounted on the die attach pad; and
a shunt resistor comprising a metal plate body portion with shunt resistor down-sets extending outwardly and downwardly from the body portion, said shunt resistor being connected to at least one of said plurality of leads by a layer of bonding material with a bond line thickness, wherein said shunt resistor down-sets penetrate said layer of bonding material and electrically engage at least one of said plurality of leads and support said shunt resistor above said leads at about the bond-line thickness of the bonding material.

14. An integrated circuit package comprising:
a leadframe having a plurality of leads;
a die mounted on the lead frame and
a shunt resistor comprising a metal plate body portion with shunt resistor down-sets extending outwardly and downwardly from the body portion, said shunt resistor being connected to at least one of said plurality of leads by a layer of bonding material with a bond line thickness, wherein said shunt resistor down-sets penetrate said layer of bonding material and electrically engage at least one of said plurality of leads and support said shunt resistor above said leads at about the bond-line thickness of the bonding material.

15. A method of making an integrated circuit package comprising:
providing a leadframe having a die attach pad and a plurality of leads;
providing a die mounted on the die attach pad;
providing a shunt resistor comprising a metal plate body portion with shunt resistor down-sets extending outwardly and downwardly from the body portion, said shunt resistor being connected to at least one of said plurality of leads by a layer of bonding material with a bond line thickness, wherein said shunt resistor down-sets penetrate said layer of bonding material and electrically engage at least one of said plurality of leads and support said shunt resistor above said leads at about the bond-line thickness of the bonding material; and
providing a layer of mold compound encapsulating at least portions of the leadframe, the die and the shunt resistor.

16. The method of claim 15, further including encapsulating at least portions of the leadframe, the die and the shunt resistor.

17. A method of making an integrated circuit package comprising:
providing a leadframe having a die attach pad and a plurality of leads;
providing a die mounted on the die attach pad; and
providing a shunt resistor comprising a metal plate body portion with shunt resistor down-sets extending outwardly and downwardly from the body portion, said shunt resistor being connected to at least one of said plurality of leads by a layer of bonding material with a bond line thickness, wherein said shunt resistor down-sets penetrate said layer of bonding material and electrically engage at least one of said plurality of leads and support said shunt resistor above said leads at about the bond-line thickness of the bonding material.

18. The method of claim 17, further including encapsulating at least portions of the leadframe, the die and the shunt resistor.

19. A method of making an integrated circuit package comprising:
providing a leadframe having a plurality of leads;
providing a die mounted on the leadframe; and
providing a shunt comprising a metal plate body portion with shunt resistor down-sets extending outwardly and downwardly from the body portion, said shunt resistor being connected to at least one of said plurality of leads by a layer of bonding material with a bond line thickness, wherein said shunt resistor down-sets penetrate said layer of bonding material and electrically engage at least one of said plurality of leads and support said shunt resistor above said leads at about the bond-line thickness of the bonding material.

20. The method of claim 19, further including encapsulating at least portions of the leadframe, the die and the shunt resistor.

21. A method of making an integrated circuit package comprising:
fabricating a leadframe having a die attach pad and a plurality of leads;
mounting a die on the die attach pad; and
connecting a shunt resistor to at least one of said plurality of leads by a layer of bonding material with a bond line thickness, the shunt resistor comprising a metal plate body portion with shunt resistor down-sets extending outwardly and downwardly from the body portion, wherein said shunt resistor down-sets penetrate said layer of bonding material and electrically engage at least one of said plurality of leads and support said shunt resistor above said leads at about the bond-line thickness of the bonding material.

22. The method of claim 21, further including encapsulating at least portions of the leadframe, the die and the shunt resistor.

23. A method of making an integrated circuit package comprising:
fabricating a leadframe having a plurality of leads;
mounting a die on the leadframe; and
connecting a shunt resistor to at least one of said plurality of leads by a layer of bonding material with a bond line thickness, the shunt resistor comprising a metal plate body portion with shunt resistor down-sets extending outwardly and downwardly from the body portion, wherein said shunt resistor down-sets penetrate said layer of bonding material and electrically engage at least one of said plurality of leads and support said shunt resistor above said leads at about the bond-line thickness of the bonding material.

24. The method of claim 23, further including encapsulating at least portions of the leadframe, the die and the shunt resistor.

25. A shunt resistor comprising a generally metal plate body portion with severed tab portions extending outwardly and downwardly from the body portion wherein the tab portions have an average thickness value less than the average thickness value of the shunt resistor.

26. A shunt resistor comprising a generally metal plate body portion with severed tab portions extending outwardly and downwardly from the body portion wherein the tab portions are half-etched.

* * * * *